(12) United States Patent
Tokito et al.

(10) Patent No.: US 6,259,423 B1
(45) Date of Patent: *Jul. 10, 2001

(54) DISPLAY DEVICE USING ORGANIC ELECTROLUMINESCENT ELEMENTS

(75) Inventors: Shizuo Tokito; Yasunori Taga, both of Aichi-ken (JP)

(73) Assignee: Kabushiki Kaisha Toyoto Chuo Kenkyusho, Aichi-gun (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/134,830

(22) Filed: Aug. 17, 1998

(30) Foreign Application Priority Data

Aug. 26, 1997 (JP) .................................................. 9-230091

(51) Int. Cl.[7] ........................................................ G09G 3/22
(52) U.S. Cl. ............................. 345/76; 313/504; 313/506; 313/509
(58) Field of Search ............................. 345/7, 8, 9, 76; 359/630; 313/498, 501, 504, 506, 507, 508, 509

(56) References Cited

U.S. PATENT DOCUMENTS

| 4,539,507 | 9/1985 | Vanslyke et al. . | |
|---|---|---|---|
| 4,847,609 | * 7/1989 | Kuwata et al. | 345/77 |
| 4,876,594 | * 10/1989 | Schiffman | 348/115 |
| 4,927,234 | * 5/1990 | Banbury et al. | 359/630 |
| 5,405,710 | * 4/1995 | Dodabalapur et al. | 428/690 |
| 5,478,658 | * 12/1995 | Dodabalapur et al. | 428/690 |
| 5,554,911 | 9/1996 | Nakayama et al. . | |
| 5,674,636 | * 10/1997 | Dodabalapur et al. | 428/690 |
| 5,780,174 | 7/1998 | Tokito et al. . | |
| 5,828,181 | * 10/1998 | Okuda | 315/169.3 |
| 6,005,651 | * 12/1999 | Takahara et al. | 349/137 |

FOREIGN PATENT DOCUMENTS

| 06275381 | 9/1994 | (JP) . |
| 08213174 | 8/1996 | (JP) . |
| 9-180883 | 7/1997 | (JP) . |

* cited by examiner

Primary Examiner—Richard Hjerpe
Assistant Examiner—Ronald Laneau
(74) Attorney, Agent, or Firm—Oblon, Spivak, McClelland, Maier & Neustadt, P.C.

(57) ABSTRACT

For use in a display device, a simple-matrix-drive-type luminescent panel is formed by stacking a dielectric mirror layer, a transparent electrode, a hole transport layer, a luminous layer, and a metal electrode on a glass substrate, wherein the transparent electrode is formed as a plurality of stripes equally spaced apart a specified distance from each other, and the metal electrode is formed as a plurality of stripes equally spaced apart a specified distance from each other and arranged at right angles with the transparent electrode stripes, and pixels are formed at intersections of the metal electrodes and the transparent electrodes and wherein in order for the pixels of the panel to emit light to display information, the application of a voltage to the pixels is controlled by selection of the electrodes according to information. This luminescent panel contributes to reductions in size and weight of the display device.

25 Claims, 10 Drawing Sheets

DISPLAY DEVICE USING ORGANIC ELECTROLUMINESCENT ELEMENTS

BACKGROUND OF THE INVENTION

1. Field of the Invention

The present invention relates to a display device using organic electroluminescent (EL) elements.

2. Description of the Related Art

Various types of display devices are known, one of which is a projector type display. This projector type display normally uses a liquid crystal panel. More specifically, a transmitted light is obtained by controlling each liquid crystal element of the liquid crystal panel according to video information and also by controlling the transmitted light by using a polarizing plate. Then, by projecting the transmitted light controlled according to the video information onto a screen, a video image is displayed.

FIG. 11 shows an example of the conventional full-color projector type display. As illustrated, a reflector 104 is disposed behind a light source 102, with the result that a parallel beam of white light is emitted forward. The parallel beam is first reflected by a mirror 106 and is then incident on a dichroic mirror 108, which is arranged tilted 45° from the optical path, and only yellow light is reflected by the mirror 108 in a direction at right angles with the optical path before reflection. Therefore, the transmitted light of the mirror 108 is red light. This red light is reflected in a specified direction by a mirror 110. When the yellow light reflected by the dichroic mirror 108 is incident on a dichroic mirror 112, green light is separated and reflected in a right-angle direction, and blue light passes through the mirror 112. The blue light reflects through mirrors 114 and 116 and goes on to a specified direction. Liquid crystal panels 120, 122 and 124, each including a polarizing plate, are disposed close to the three sides of a dichroic lens 126 and accept red light, green light and blue light, respectively. The liquid crystal panels 120, 122 and 124 cause the red, green and blue light, modulated by the control of the liquid crystals, to fall on the dichroic lens 126. The dichroic lens 126 combines those rays that go into the above-mentioned three sides to form a parallel beam, which is emitted from the one other side. A screen 130 is installed across a lens 128 in front of the one other side of the dichroic lens 126. The red, green and blue rays, which have been modulated separately by the liquid crystal panels 120, 122 and 124, are combined, and a full-color image is displayed on the screen 130.

Among the projector type display devices are audio-visual displays to show a TV screen or the like and head up displays (HUD) used in automobiles or airplanes. In the HUD, light rays that have passed through the liquid crystal panel are projected by means of a dichroic filter or a hologram optical element.

FIG. 12 shows an example of the structure of a conventional dichroic system HUD. In front of a light source 140 formed by a halogen lamp (or a xenon lamp), there is a liquid crystal panel 142. A transmitted light of the liquid crystal panel 142 passes through a shutter 144, a mirror 146 and a collimating lens 148, and is applied to a dichroic filter 150 attached to the inner surface of the windshield glass. Thus, a virtual image of an image modulated by the liquid crystal panel 142 appears in front of the windshield glass.

FIG. 13 shows an example of the conventional hologram system HUD. A light from a light source 160 formed by a halogen lamp (or a xenon lamp) or a CRT (cathode ray tube) is injected into a liquid crystal panel 162 that includes a polarizing plate. The light, modulated by the liquid crystal panel 162, passes through an aberration-corrected lens system 164 and a mirror 166, and is projected onto a hologram optical element (a diffraction grating) 168 provided on the windshield glass. Accordingly, a virtual image of an image formed in the liquid crystal panel 162 is made to appear in front of the windshield glass.

Incidentally, in the display mentioned above, light loses its power greatly when it passes through the liquid crystal panel. To produce color images, three primaries are generated from white light emitted from a light source, and the rays of three primaries are transmitted through the three liquid crystal panels, respectively. In this case, the utilization factor of light is 10% or so. Therefore, to produce bright images, it is required to irradiate the liquid crystal panel with light at a high luminance of about 10000 cd/m$^2$. Normally, a metal halide lamp or a halogen lamp is used as the light source. A high voltage needs to be used for the light source, and in this case, there is a problem that high heat is generated by the light source. To obtain an adequate transmitted light, it is necessary to irradiate the liquid crystal panel with light with sufficient parallelism. To this end, it is necessary to provide the light source with a large reflector, which is a hindrance to the movement toward weight and size reductions of the device itself. Another problem is the need to provide a large cooling fan for the light source.

With regard to the HUD in automobiles or airplanes, there are requirements to decrease the size, weight and energy consumption. Those problems with the projector type display have been obstacles to the widespread use of HUD.

In the area of devices for information display, there are CRT, the liquid crystal display, the plasma display, the inorganic EL display and so on. However, these kinds of displays are designed to provide a wide angle of field, and make it possible for the viewers to look at the displayed information from a diagonal direction. On the other hand, with some displays, it is desired that the angle of field be limited. In the liquid crystal displays, which are not spontaneous luminescent type displays, the angle of field can be narrowed easily, but there is a problem that it is difficult to achieve an image display with high luminance. With display on the instrument panel of a car, it is required that an information display should be visible to the driver only and that high luminance should be provided to secure enough visibility even when there is direct sunlight coming into the car. Therefore, in view of the above requirements, the liquid crystal display device was not preferable. There are displays that use LED or a fluorescent indicator tube (a magic eye), but they are only capable of simple display, and are not suitable for display with high resolution.

SUMMARY OF THE INVENTION

It is an object of the present invention to provide a display device simple in structure and easy to reduce the size and weight.

According to the present invention, a display device comprises a luminescent panel (organic EL panel) having organic electroluminescent elements (organic EL elements) arranged in a matrix, and a driver for driving the individual organic EL elements of the luminescent panel on the basis of video information.

As described above, in the present invention, the luminescent panel is formed by arranging the organic EL elements in a matrix formation. Therefore, an image can be displayed according to video information, that is, by causing desired organic EL elements to emit light. Being spontaneous luminescence elements, the organic EL elements do not require a light source. The organic EL panel, which generates light according to video information, does not require a transmission type liquid crystal panel or the like, and therefore the generated light can be utilized one hundred percent. As a result, the organic EL panel can make a high-luminance image display with ease. Furthermore, being capable of outputting images only with the organic EL panel, the display device according to the present invention can be formed in a simple structure, and can be produced in a smaller size and with a lighter weight easily. If a liquid crystal panel is used, a light source needs to be added, and because of this, a problem of heat generation arises. However, heat generation is less of a problem with the organic EL panel. On the contrary, there is a merit that its flat panel is superior in heat dissipation.

Suitable for this organic EL panel is a micro-optical resonance type organic EL element disclosed in Japanese Patent Laid-Open Publication No. Hei-9-180883. By the use of an organic EL element such as this, it is possible to obtain light with high luminance, high directivity and better monochromaticity. It also becomes possible to easily display an image with a high luminance of 10000 $cd/m^2$.

An organic EL element such as this is formed by stacking a dielectric mirror, a transparent electrode, a hole transport layer, a luminous layer, and a metal electrode on a glass substrate. By placing the transparent electrodes and the metal electrodes so that their stripes perpendicularly intersect each other, the pixels can be arranged at the intersections of those electrodes in a matrix formation. Accordingly, a display device with a simple matrix type drive can be realized by controlling the application of a voltage between the transparent electrodes and the metal electrodes.

The light from the organic EL panel is preferably projected through a projection lens to a screen. Being free from power attenuation during transmission through the liquid crystal or the polarizing plate, the present invention can realize a high-luminance projector type display.

Preferably, three matrix type organic EL panels for different luminescent colors are provided, the light emission of those panels is controlled according to information, and the rays of different colors are combined and projected onto a screen. By allotting the three organic EL panels to the three primary colors (R, G and B), a full color image can be displayed on the screen. In the case of a conventional full-color projector type display, the light from the light source must be separated by dichroic mirrors, for example, into primaries R, G and B, so that the device necessarily becomes large in size. Another problem is that because the light must be sufficiently parallel, the production of the optical system is troublesome, and its weight becomes heavy. Moreover, the dichroic mirrors are very expensive. In order to produce a distinct image, the liquid crystal is required to have a large contrast ratio (100:1 to 1000:1). In addition, the luminance of the light source is required to be 10000 $cd/m^2$ or higher.

In the above-mentioned structure according to the present invention, the organic EL panels generate primaries R, G and B with high directivity, respectively, so that the structure of the device is simple and the optical system can be obviated. Furthermore, the organic EL panel can produce a high luminance, for which reason a distinct image can be obtained easily, and not many problems, such as heat generation, will be encountered.

Preferably, the light, including video information, which is generated by the organic EL panel is utilized in the head up displays. With the head up displays, particularly those attached to the windshield glass of vehicles, a sufficient visibility of information displayed must be secured without sacrificing the visibility of the view in front of the car, and a light source for very high luminance of the screen is required. At present, the luminance of the xenon lamp is 3000 $cd/m^2$ and its service life is about 100 hours. As an ideal light source, a light source should desirably have a life of 10000 hours when used at a luminance of 10000~15000 $cd/m^2$, but such a light source has yet to be developed. When a Fresnel lens or the like is used, because of its low light transmittance and the no directivity of the emitted light, there is a great loss of light.

With the organic EL panel, since the panel generates light by itself, the produced light can be utilized one hundred percent. Therefore, the organic EL panel can perform display with high luminance while keeping light loss a minimum level. When the organic EL panel is used, the display can be structured in a simple form, thus offering chances of reductions in size and weight. When a display is mounted on a vehicle, the essential requirement of the display is a compact size, and to this end, it is most desirable to use the organic EL panel. Be it a dichroic system or a hologram system, an organic EL panel can preferably be used.

In addition, the organic EL panel should preferably be used as is to achieve a high-directivity display. As described above, the micro-optical resonance type organic EL element has high directivity. Therefore, an organic EL panel using those organic EL elements provides better visibility to the viewer who squarely faces the panel, but the visibility decreases sharply when the viewer shifts to either side. With a display on the instrument panel of a vehicle, the visibility should be secured only for the driver, so that this type of display should preferably be used. By arranging to provide a high visibility when the driver sits up straight, the driver can be made to straighten up. With the organic EL panel, images can be displayed with a high luminance of 10000 $cd/m^2$ or higher, as the result, the driver can easily view the displayed information when the sun is shining in through the window or the driver is an elderly person.

DESCRIPTION OF PREFERRED EMBODIMENT

An embodiment of the present invention will be described with reference to the accompanying drawings.

[Structure of the Organic EL Panel]

Figure 1:
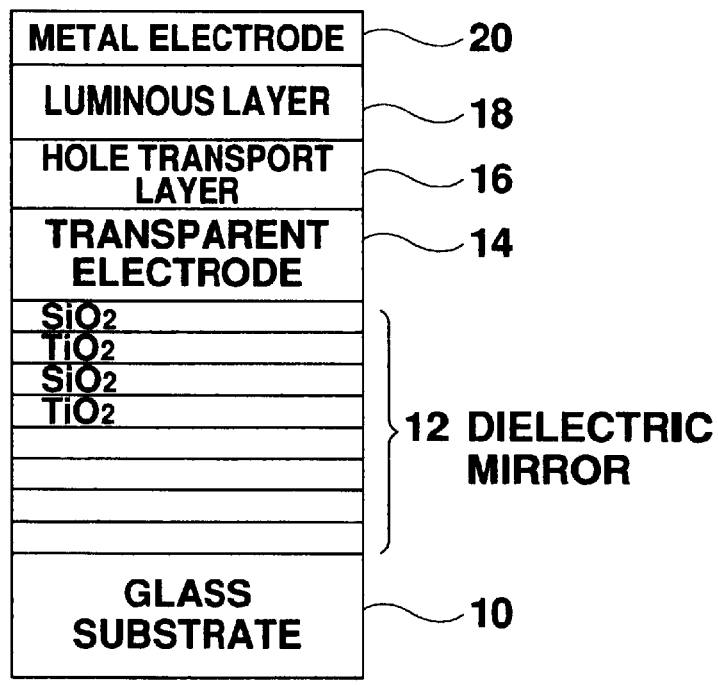
FIG. 1 is a diagram showing the structure of the organic EL panel.

FIG. 1 is a diagram showing the structure of an example of an organic EL panel according to a preferred embodiment of the present invention. The basic structure of a piece of electroluminescent element is the same as in Japanese Patent Laid-Open Publication No. Hei-9-180883. This element is organized by forming a dielectric mirror 12, a transparent electrode 14, a hole transport layer 16, a luminous layer 18, and a metal electrode 20 in this order on a glass substrate.

The glass substrate 10 is in a rectangular form with two 2.5-inch diagonal lines. The dielectric mirror 12 is obtained by alternately forming a $SiO_2$ layer and a $TiO_2$ layer. Each layer of $SiO_2$ and $TiO_2$ of the dielectric layer 12 is determined so as to be ¼ of a 580-nm wavelength of the center frequency of the stop band. The transparent electrode 14 is formed of ITO (indium tin oxide), and the space between the metal mirror and the dielectric mirror is set at about ½ of or about the same as the wavelength of light that is made to resonate. In this example, the thickness of the transparent electrode 14 is 40 nm.

For the hole transport layer 16, a triphenyldiamine derivative is used, and its thickness is set at 55 nm. For the luminous layer 18, an alumiquinolinol complex is used, and its thickness is set at 40 nm. This luminous layer 18 is doped with about 1% quinacridone in order to improve luminous efficiency. The thickness of an organic layer consisting of the hole transport layer 16 and the luminous layer 18 is set such that the resonance wavelength becomes a wavelength of 535 nm, which is close to a peak on the short wavelength side of the emission spectrum of quinacridone to prevent other resonance wavelengths from occurring in the spectrum of quinacridone. For the metal electrode 20, MgAg is used.

The structures of the triphenyldiamine derivative, the alumiquinolinol complex, and quinacridone are shown below.

[Chemical Formula 1]

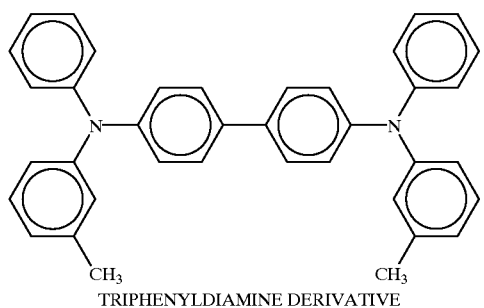
TRIPHENYLDIAMINE DERIVATIVE

-continued

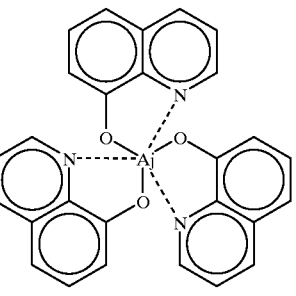
ALUMIQUINOLINOL COMPLEX

QUINACRIDONE

Figure 2:
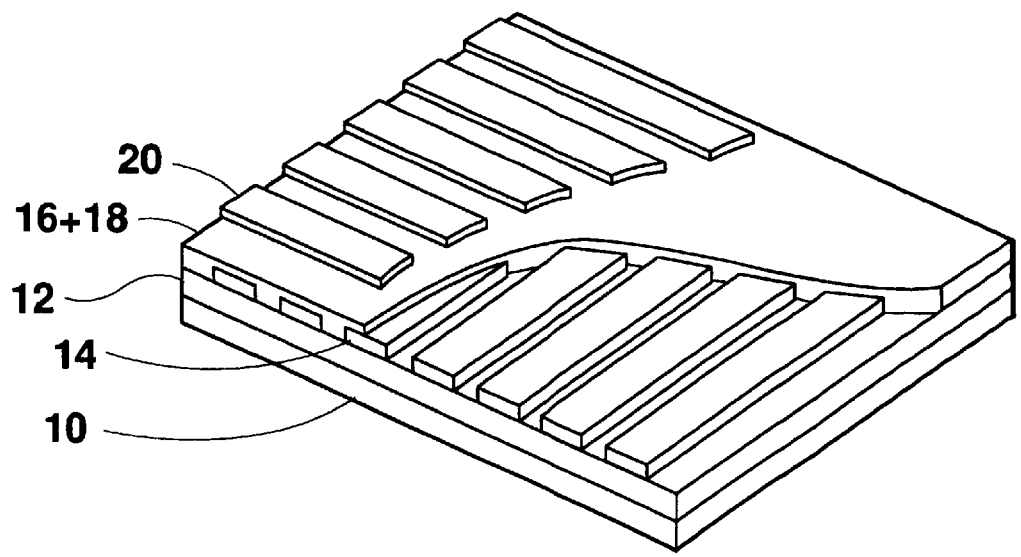
FIG. 2 is a perspective view showing the structure of the organic EL panel.

The organic EL panel according to the present embodiment includes the transparent electrodes 14 and the metal electrodes arranged so as to intersect each other as shown in FIG. 2, and the organic EL elements are located at the intersections of the two kinds of electrodes. More specifically, the organic EL panel is a simple matrix type panel, which includes 20 horizontal lines of the 2-mm-wide transparent electrodes 14 and 30 vertical lines of the 2-mm-wide metal electrodes 20.

This organic EL panel is formed as follows. The dielectric mirror 12 and the transparent electrode 14 are deposited by the RF magnetron sputtering process. The transparent electrode 14 is etched so as to be in stripes by wet etching. Then, the hole transport layer 16 and the luminous layer 18 and the metal electrode 20 are deposited in this order by the vacuum evaporation process. The metal electrode 20 is formed in stripes by using a mechanical mask. Subsequently, the organic EL panel is encapsulated by a glass plate and a ultraviolet cured resin. If necessary, the panel may be fitted on its rear side with a radiator plate or a cooling fan to restrain the temperature rise of the panel.

Figure 3:
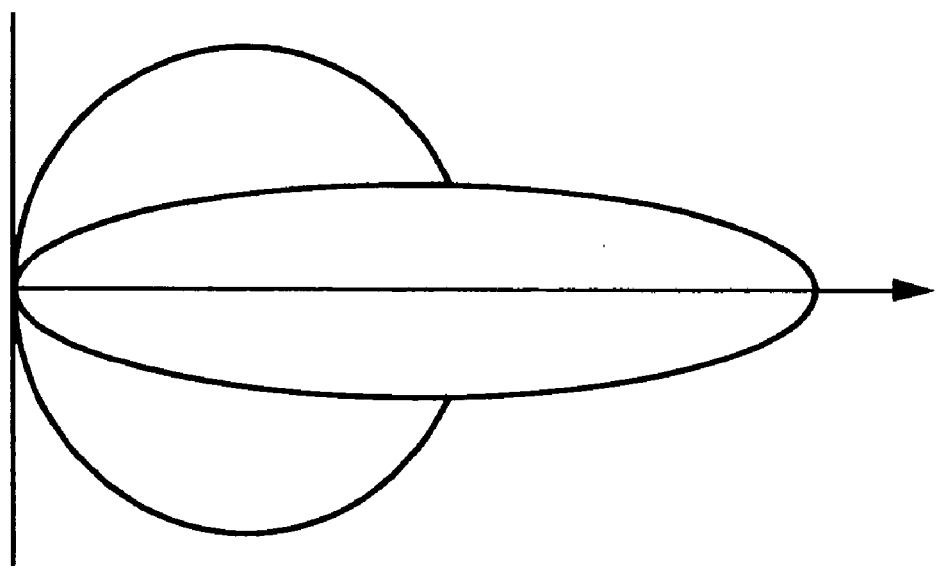
FIG. 3 is a diagram showing a luminescence pattern.

In the organic EL panel according to the present embodiment, the dielectric mirror 12 and the metal electrode 20 constitute a micro-optical resonator. This micro-optical resonator causes resonance of a ray of a specific wavelength among the rays output from the organic layer made of the hole transport layer 16 and the luminous layer 18, and this ray is radiated with high directivity in the direction of the front face of the panel. FIG. 3 is a schematic diagram of the emission pattern. As depicted, a ray with high directivity is emitted in the direction of the front face.

Therefore, by increasing the luminance in the direction of the front face, a high-luminance panel can be realized. The above-mentioned structure is an example, and thus for the materials of the layers of the organic EL panel, various kinds of materials described in Japanese Patent Laid-Open Publication No. Hei-9-180883 may be adopted. The material and the thickness are varied with different kinds of luminescent color.

[Structure of the Driver Circuit]

Figure 4:
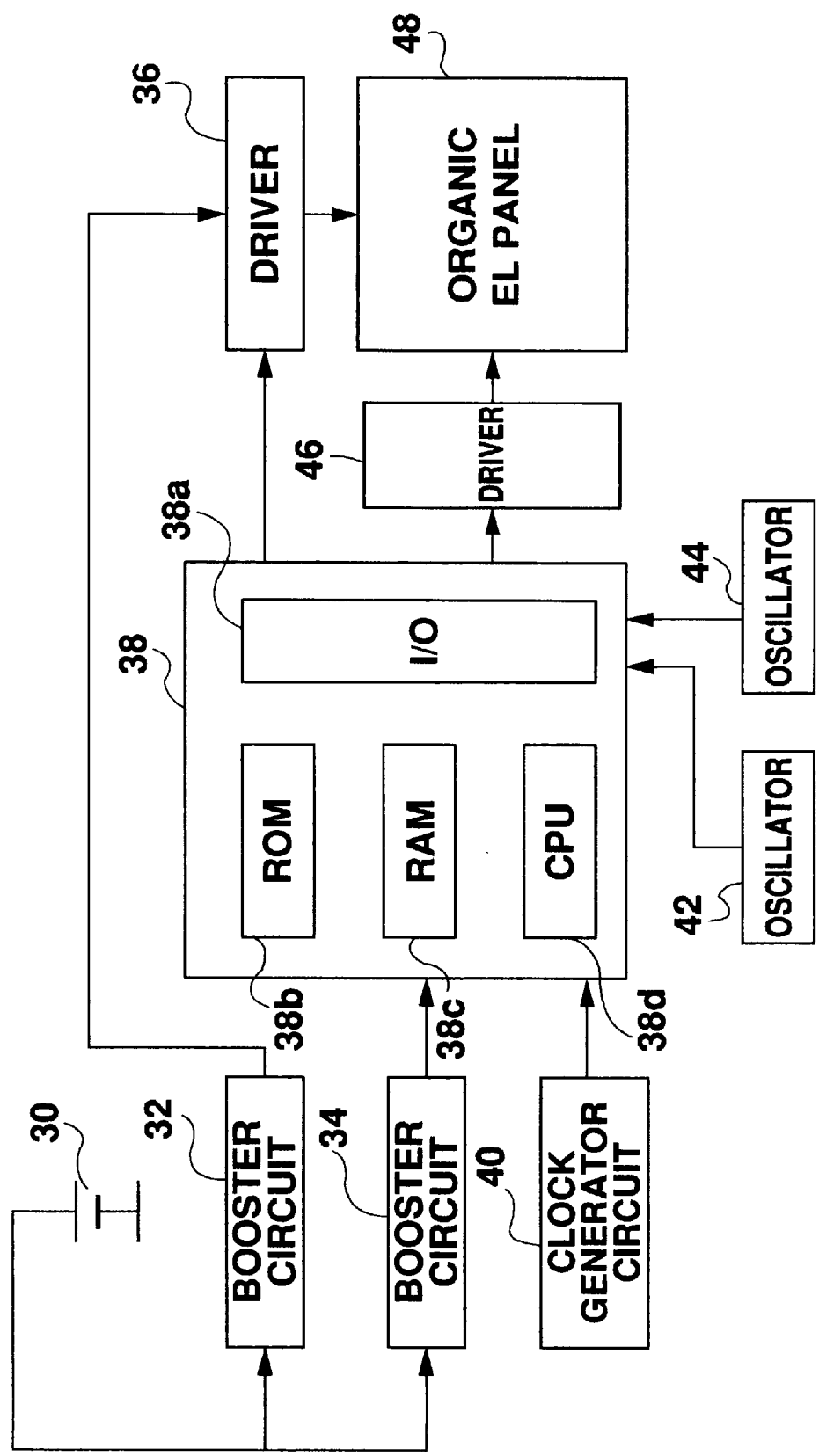
FIG. 4 is a block diagram showing the general composition of the display, including driver circuits.

FIG. 4 shows an example of the structure of the organic luminescent panel, which also shows driver circuits. Two booster circuits 32, 34 are connected to a 4.5V DC power source 30. The booster circuit 32 can output voltages in the range of 5V to 12V. The output voltage of this booster circuit 32 is supplied to a driver 36. The booster circuit 34 outputs a constant voltage of 5V. The output voltage of the booster circuit 34 is supplied as a source voltage to a microcomputer 38. The microcomputer 38 comprises an I/O interface 38a for exchange of signals with outside devices, a ROM 38b for storing programs, a RAM 38c for storing various items of data, and a CPU 38d for performing various operations. A clock generator circuit 40, connected to the microcomputer 38, supplies clock signals to set timing of actions at a frequency of 8 MHz. Two oscillators 42, 44 are connected to the microcomputer 38. The oscillator 42 supplies signals of 5 MHz to 50 MHz to control displaying speed, and the oscillator 44 supplies signals of 0.2 kHz to 2 kHz to control scanning frequency.

An organic EL panel 48 is connected through two drivers to the microcomputer 38. The driver 36 is a circuit to control whether or not to apply a voltage, supplied from the booster circuit 32 as described above, to the organic EL panel, and is formed of transistors respectively connected to the vertical electrodes in the organic EL panel 48. When a transistor in the driver 36 is turned on, a voltage from the booster circuit 32 is applied to a vertical electrode connected to this transistor. On the other hand, the driver 46 is formed of transistors respectively connected to the horizontal electrodes in the organic EL panel 48. When a transistor in the driver 46 is turned on, a horizontal electrode connected to this transistor is connected to earth.

In the display device structured as described, when the microcomputer 38 controls the drivers 36 and 46 to turn on one transistor each, voltage is applied across one vertical electrode and one horizontal electrode, with the result that an organic EL element at the intersection of the two electrodes emits light. Therefore, when one horizontal line is selected by a transistor of the driver 46 and under this condition the driver 36 turns on the transistors specified by data for that line, the display of data is effected at the pixels of one horizontal line. By repeating this scanning action in the vertical direction, the display of one picture can be achieved. Preferably, the horizontal driver 36 is provided with a data register for one line to thereby drive the transistors according to stored data.

Video data for display may be supplied externally in step with the internal display cycle. Prearranged patterns of characters or the like may be stored in ROM 38B and displayed. In ordinary NTSC-system television broadcast, a video signal is sent at horizontal and vertical scanning frequencies specified by a standard. The horizontal and vertical synchronizing signals are separated from the video signal, and the video component is converted into digital signals corresponding to the number of pixels of the organic EL panel. As those signals are supplied to the microcomputer 38, the video signal is displayed on the organic EL panel 48 in step with the horizontal and vertical synchronizing signals.

[Structure of the Mono-color Display]

Figure 5:
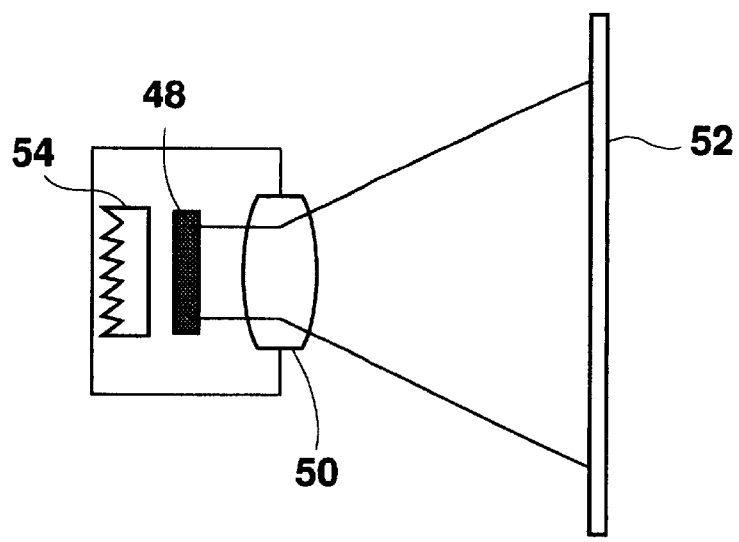
FIG. 5 is a diagram showing the structure of a mono-color display.

FIG. 5 shows an example of a projector type display utilizing the above-mentioned organic EL panel 48. In this example, a mono-color display is performed. A projection lens 50 is placed in front of the organic EL panel 48. Further ahead of the panel 48, a screen 52 is set. Thus, a displayed image on the organic EL panel 48 is magnified by the projection lens 50, and brought to a focus on the screen 52. In other words, the image on the organic EL panel 48 is projected onto the screen 52. The radiator plate 54 is used to dissipate the heat of the organic EL panel 48.

In the display structured as described, characters were displayed by driving the organic EL panel 48 with a matrix of 30 horizontal lines ×20 vertical lines, a duty ratio of 1/32, and a voltage of 15V. The luminescent color was green with better monochromaticity, the luminance on the organic EL panel 48 was 10000 cd/m$^2$, the luminance on the screen 52 was 200 cd/m$^2$, and a distinct image was projected on the screen 52.

According to the present embodiment, the organic EL panel emits light by itself, and also serves as information conversion means for converting video information into light. Therefore, the organic EL panel 48 performs two functions as a light source in a projector type display that uses a liquid crystal panel, and also as a liquid crystal panel. Accordingly, the organic EL panel 48 is very simple in structure. Since the organic EL panel 48 emits light spontaneously, there is no light loss that would occur when light is passed through a liquid crystal panel or a polarizing plate, for which reason the light utilization factor is high. Thus, it is easy to produce bright images, and heat generation is relatively low. On the flat organic EL panel 48, a radiator plate or the like can be installed easily and will exhibit great cooling efficiency. Therefore, the display device can be reduced in size and weight by simplifying the general configuration of the device, and therefore clear images can be produced.

For the screen 52, a reflection type screen or a transmission type screen can be applied. The screen can be used also for a display device on a vehicle with a limited display area.

[Structure of the Full-Color Display]

Figure 6:
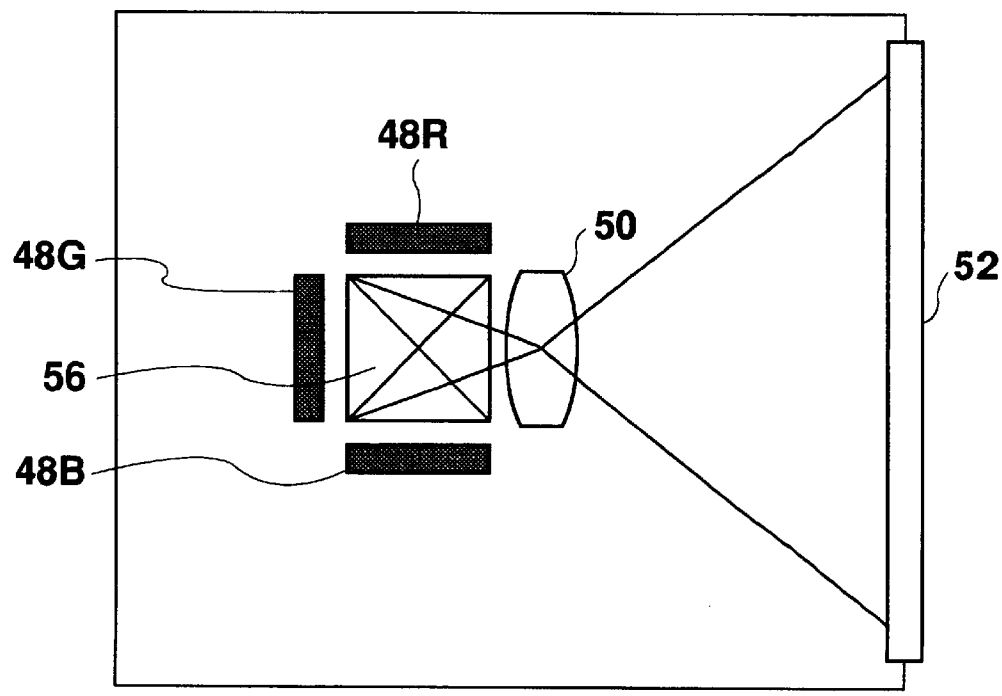
FIG. 6 is a diagram showing the composition of a full-color display.

FIG. 6 shows a full-color projection type display. As illustrated, this display uses three organic EL panels 48R, 48G and 48B for red, green and blue rays. Those three organic EL panels 48R, 48G and 48B are arranged close to the three sides of a dichroic prism 56. A projection lens 50 is arranged in front of the one other side of the dichroic prism 56. A screen 52 is disposed further ahead of the projection lens 50.

The dichroic prism 56 combines the rays coming in from the three sides, and emits the rays toward the projection lens 50. Therefore, the rays generated in the three organic EL panels 48R, 48G and 48B are combined to form a full-color picture on the screen 52. The three organic EL panels 48R, 48G and 48B may be driven according to display data of R, G and B colors.

The organic EL panel 48G for green light may be structured as described above. The organic EL panel 48B for blue light may be formed by making the luminous layer of a benzoxazole zinc complex and setting the resonance wavelength at 450 nm. The organic EL panel 48R for red light may be realized by forming the luminous layer of DCM and setting the resonance wavelength at 610 nm. The structures of a benzoxazole zinc complex and DCM are shown below.

[Chemical Formula 2]

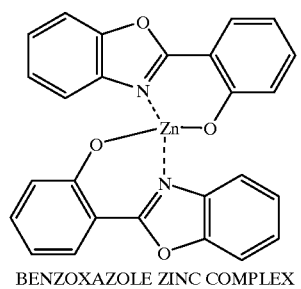

BENZOXAZOLE ZINC COMPLEX

-continued

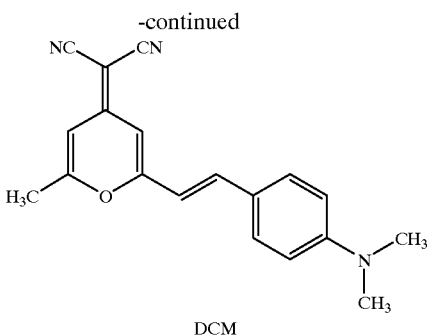

DCM

Figure 7A:
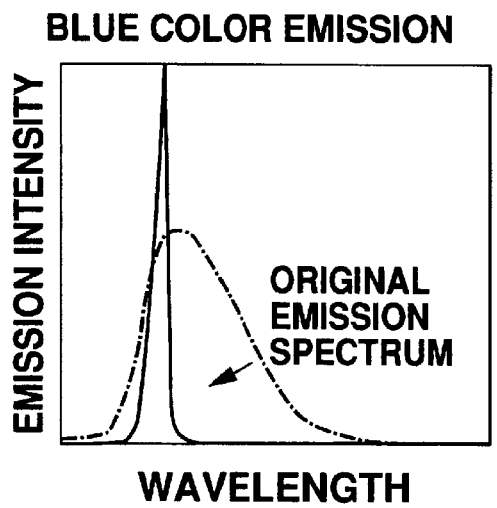
FIGS. 7a, 7b and 7c are diagrams showing wavelengths of luminescence.
Figure 7B:
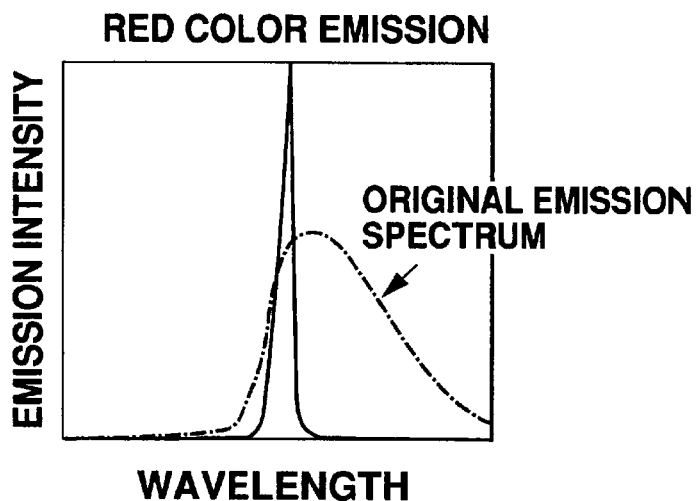
Figure 7C:
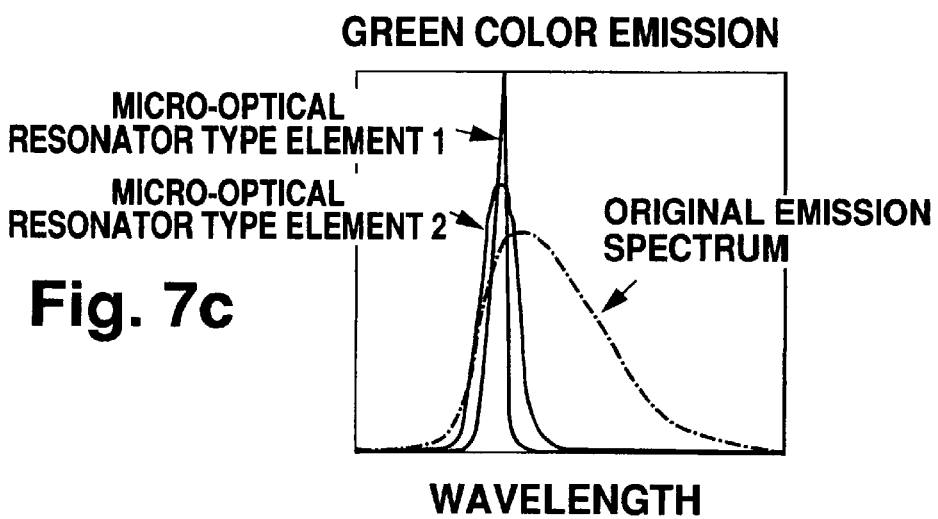

The number of layers and the reflectance of the dielectric mirror 12 can be varied, with the result that the spectral half-width of an emission wavelength (corresponding to color purity) and the degree of light amplification can be controlled. Furthermore, fine adjustment of an emission wavelength is possible by varying a resonance wavelength. In other words, by providing a resonator, each luminescent color can be made to have better monochromaticity than the luminescent color from the organic layer as shown in FIGS. 7a, 7b and 7c. As depicted in FIG. 7c, by changing the total number of layers of the dielectric mirror 12, the degree of monochromaticity can be varied. Therefore, the luminescent color can be selected to suit the purpose of use or the user. By this method, a full-color display can be adjusted finely. Note that the adjustment of a luminescent color can also be done on a mono-color display.

In the display according to the present embodiment, it is only necessary to provide organic EL panels 48R, 48G and 48B close to the dichroic prism 56, so that the display structure is very simple and can be made in a compact form. More specifically, a projector type display using a liquid crystal panel requires a complicated optical system to generate R, G and B rays. In contrast, the organic EL panel, being capable of emitting R, G and B rays by itself, does not require such a complicated optical system at all. Being free from the problem of attenuation as in light transmission through a liquid crystal or a polarizing plate, the organic EL panel can produce images with high luminance.

Figure 14A:
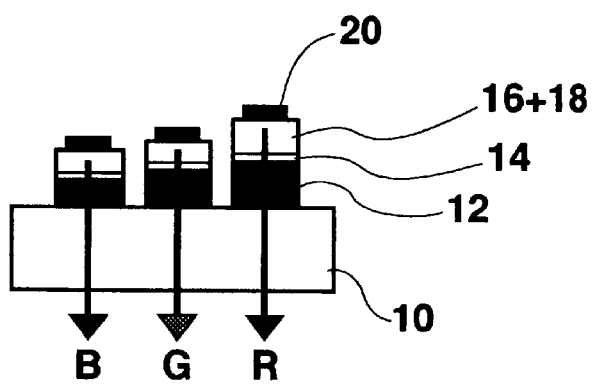
FIGS. 14A and 14B are diagrams showing a structure that enables a full-color display by a single luminescent panel.
Figure 14B:
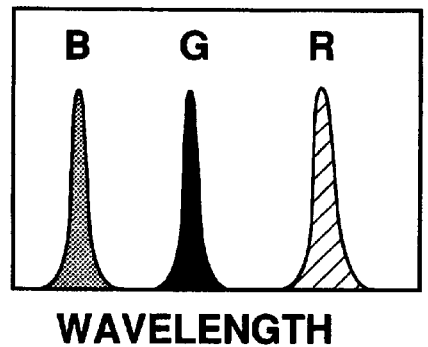

In the present embodiment, the organic EL panels 48R, 48G and 48B for R, G and B color are provided separately, but they can be incorporated in a single panel. More specifically, as shown in FIGS. 14A and 14B, by arranging the organic EL elements of primary colors successively and in a matrix formation and making the R, G and B pixels emit light according to video signals, a full-color display on a single organic EL panel can be achieved. In this case, the general structure of the device is the same as in the mono-color display shown in FIG. 5, in other words, a single organic EL panel 48 can effect a full-color display.

[Hologram System HUD]

Figure 8:
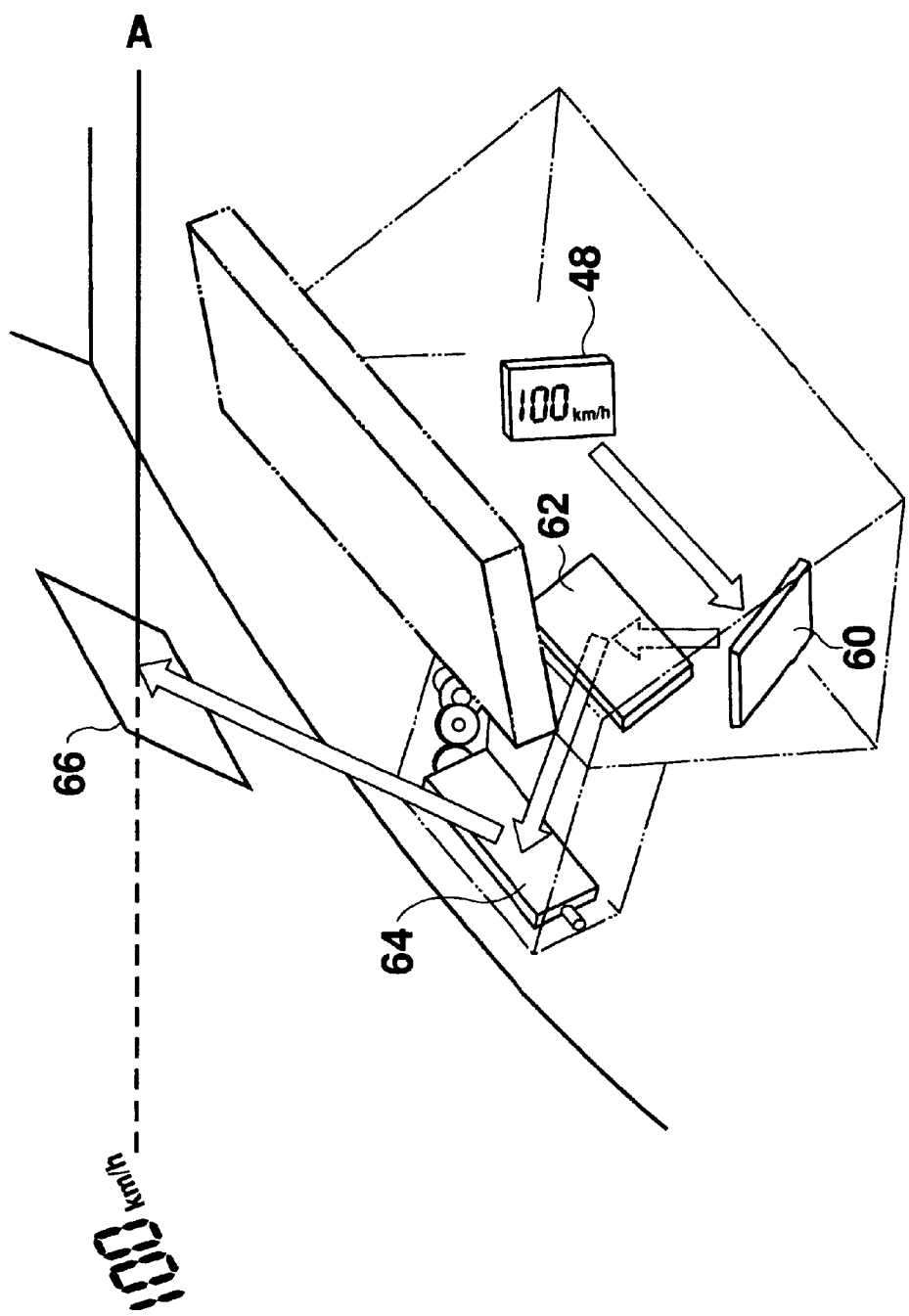
FIG. 8 is a diagram showing the structure of a hologram system HUD.

FIG. 8 shows a structural example of a hologram system head up display (HUD) mounted on a vehicle. As illustrated, two mirrors 60 and 62 are arranged in front of an organic EL panel 48 to thereby control the direction of light output by emission of the organic EL panel 48. This light strikes a holographic lens 64, by which the light is reflected.

The reflected light is applied to a combiner 66 attached to the inner surface of the windshield glass. To the driver's eyes, a virtual image appears to be in front of the windshield glass, which corresponds to an image displayed on the organic EL panel 48. For example, preferably, a virtual image should be formed about 2 m ahead of the windshield glass.

With this kind of display device, rays of light for projection were conventionally obtained by passing light from a light source through a liquid crystal panel. In this conventional device structure, the light attenuation by the liquid crystal panel is great, so that it is necessary to provide a light source of large light quantity to obtain a high luminance. Therefore, the heat generated by the light source is large and heat dissipation has been a troublesome problem.

In the present embodiment, not much heat is generated because the organic EL panel 48 emits light by itself, and heat can be dissipated relatively easily because the organic EL panel 48 is flat in shape. Its structure is simpler than in a type of device that has a light source and a liquid crystal panel provided separately. Therefore, the general device structure can be made in a compact form. In an application as a full-color display, because of its very simple structure, it can be preferably mounted on a vehicle.

[Dichroic System HUD]

Figure 9:
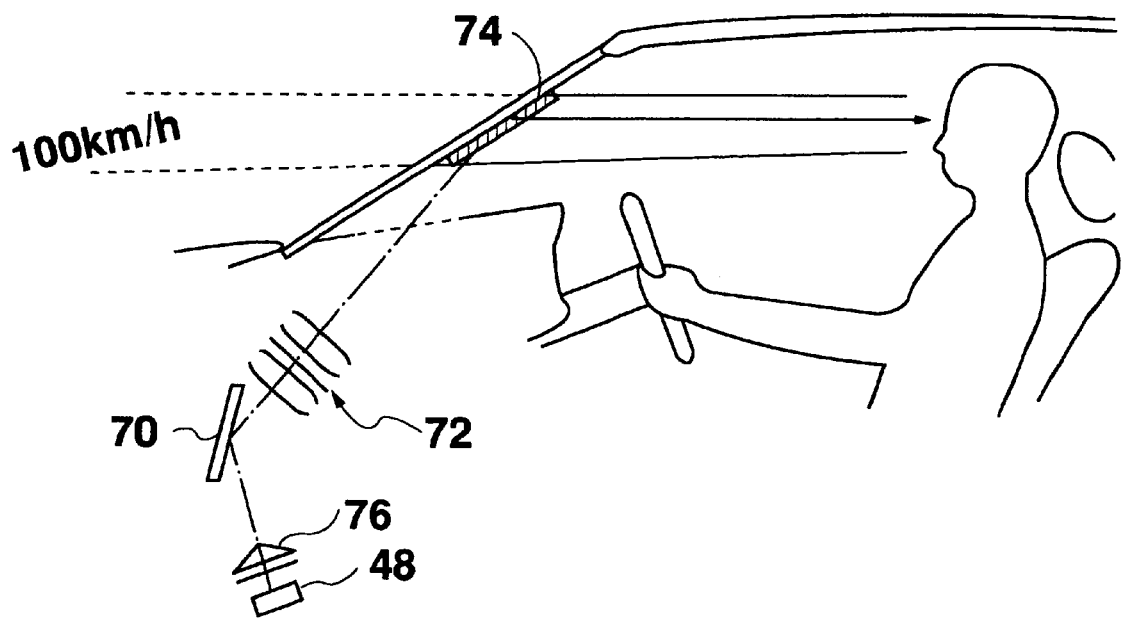
FIG. 9 is a diagram showing the structure of a dichroic system HUD.

FIG. 9 shows a structural example of a dichroic system head up display (HUD) mounted on a vehicle. A mirror 70 is arranged in front of an organic EL display 48, and the light reflected from the mirror 70 passes through a collimating lens 72, and is applied to a dichroic filter 74 attached to the inner surface of the windshield. Therefore, a virtual image of an image of the organic EL panel 48 appears to be ahead of the windshield. A shutter 76 is provided to prevent a reverse convergence of sunlight by the collimating lens 72. Even in this structure, as in the hologram system HUD mentioned above, a compact-size device can be produced and cooling can be facilitated.

[Direct-Viewing Display]

In the above-mentioned structure, the projector type display has been described. However, since the organic EL panel 48 performs display by spontaneous luminescence, this panel can be used as a direct-viewing display.

The organic EL panel 48 according to the present embodiment has a resonator portion including the dielectric mirror 12 and the metal electrode 20. Therefore, light with high directivity is emitted in the direction of the front face of the organic EL panel 48. For this reason, it is possible to provide a display which features high visibility with high luminance for a viewer in front of the screen but has lower visibility for viewing from other directions.

Figure 10:
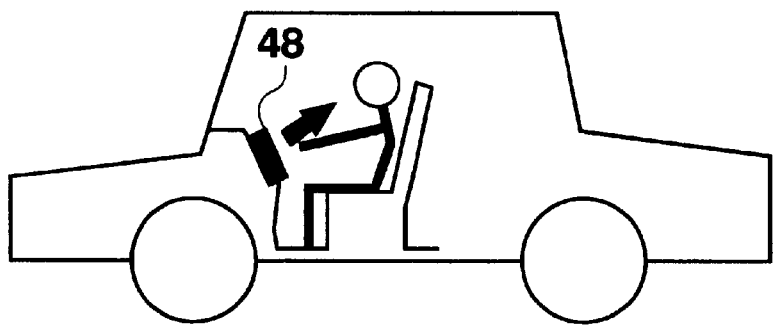
FIG. 10 is a diagram showing the arrangement of a direct viewing type display.
Figure 11:
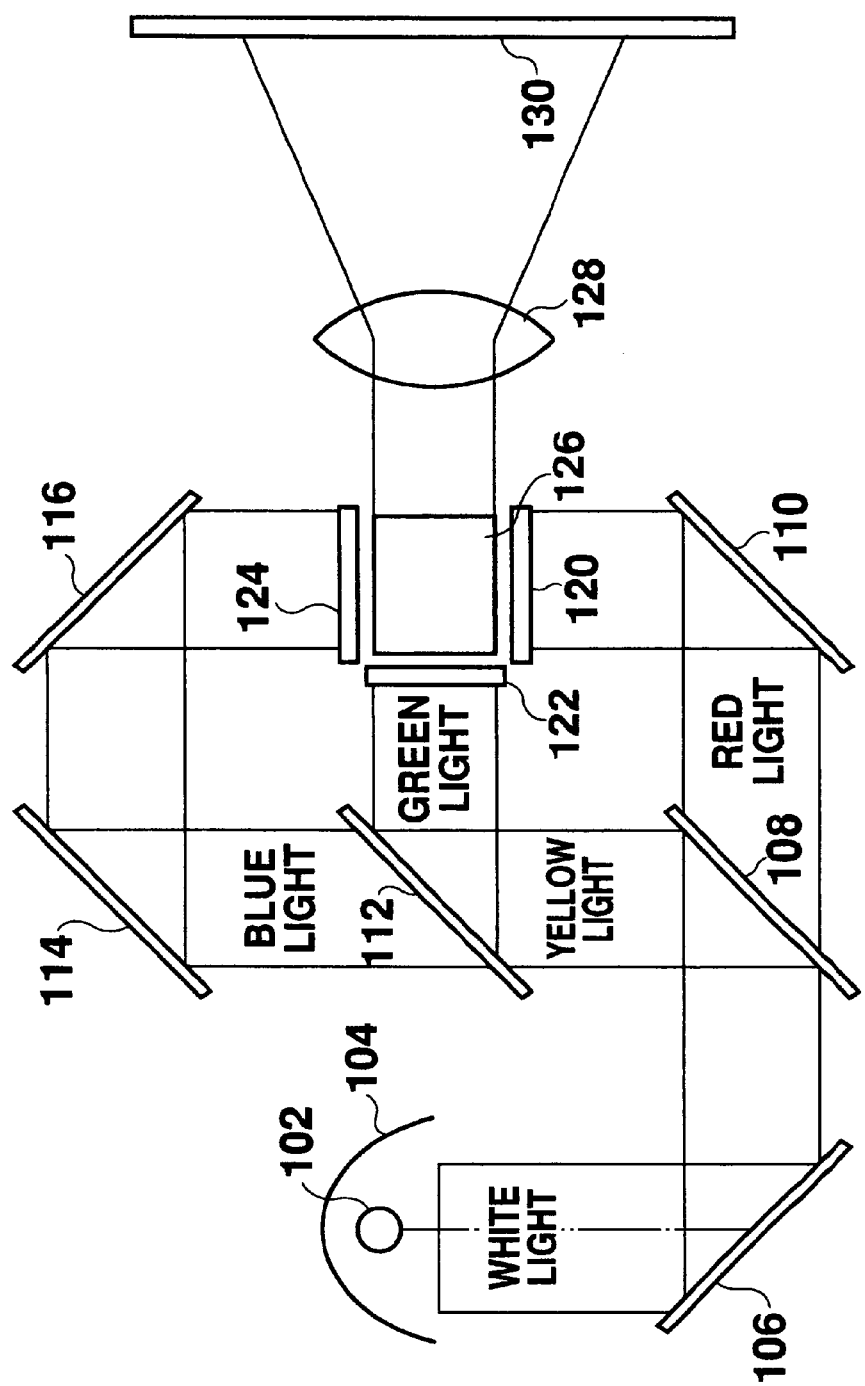
FIG. 11 is a diagram showing the structure of a conventional full-color display.
Figure 12:
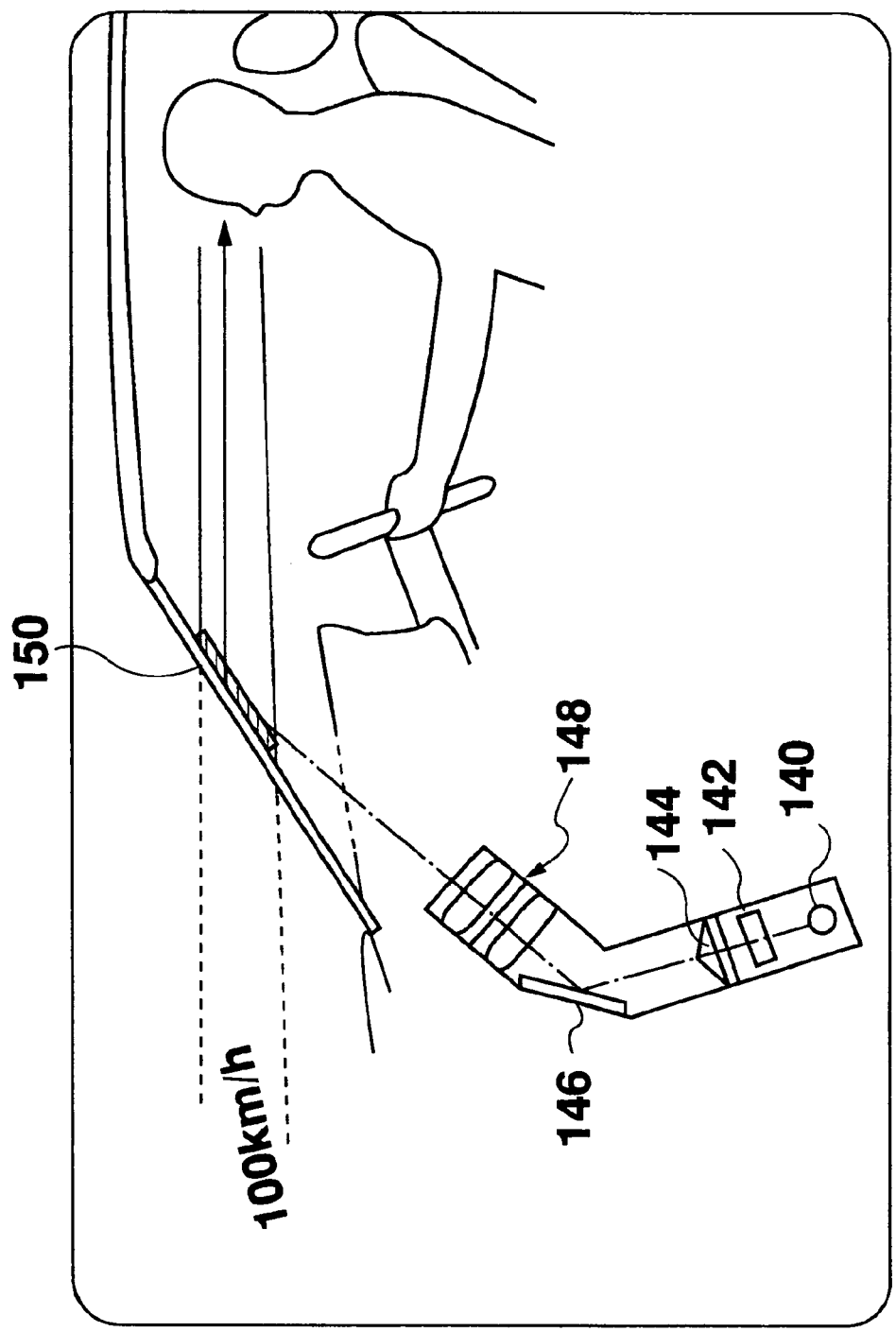
FIG. 12 is a diagram showing the structure of a conventional dichroic system HUD.
Figure 13:
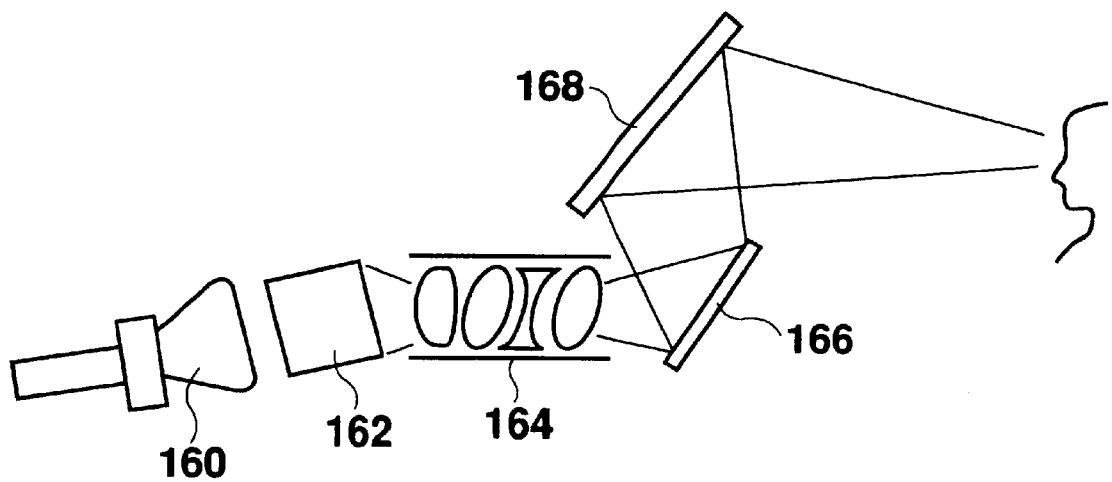
FIG. 13 is a diagram showing the structure of a conventional hologram system HUD.

By the organic EL panel 48 shown in FIG. 10, characters were displayed with a duty ratio of 1/32 and a voltage of 10V. When measured in front of the display screen, the luminance was 500 cd/m$^2$. A display of green color with better monochromaticity could be confirmed. From a position 45° sheering off from the front face, the luminance was 50 cd/m$^2$, and a displayed image was indistinct. With an organic EL panel 48 without the dielectric mirror 12, the luminance at the front face was about 200 cd/m$^2$, and a displayed image was visible also from a diagonal direction. The color purity was worse than in the present embodiment.

A high-directivity display such as this can be preferably used for an onboard display, an instrument panel display for example. In other words, as shown in FIG. 10, by installing a display so that it is distinct and highly visible only to a driver sitting correctly in the driver's seat, the driver can be made conscious of safe driving in a correct posture. A high-luminance image display is possible at 500 cd/m$^2$ or higher. This bright display serves to make a farsighted elderly driver narrow his or her eyes unconsciously. Narrowing the eyes reduces chromatic aberration and helps the driver see a sharp image of display on the instrument panel nearby, that is to say, display becomes more easily visible. Also, because a sufficient luminance is obtainable, a secure display can be effected even when the sun shines through the window.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A display device comprising:
   a) a luminescent panel having a plurality of organic electroluminescent elements arranged in a matrix formation, wherein each of said plurality of organic electroluminescent elements includes:
   a dielectric mirror,
   a transparent electrode formed on said dielectric mirror,
   a plurality of organic layers including a luminous layer, formed on said transparent electrode, and
   a metal electrode formed on said plurality of organic layers; and
   b) a driver for driving said electroluminescent elements on said luminescent panel.

2. A display device according to claim 1, wherein said transparent electrode and said metal electrode intersect, said luminescent panel having a pixel arranged at an intersection of said transparent electrode and said metal electrode in a matrix formation, and wherein display is performed by a matrix drive that controls a voltage between said transparent electrode and said metal electrode.

3. A display device according to claim 1, further comprising a projection lens through which light from said luminescent panel is projected onto a screen.

4. A display device according to claim 3, further comprising additional luminescent panels, each of the luminescent panels having different luminescent colors, light emission of said panels being individually controlled, and rays of light from said luminescent panels being combined and projected onto a screen.

5. A display device according to claim 4, wherein said luminescent panels respectively emit red, green and blue rays of light.

6. A display device according to claim 5, wherein the rays of light from said luminescent panels are combined by a dichroic prism.

7. A display device according to claim 1, wherein light including video information generated from said luminescent panel is used in a heads-up display system.

8. A display device according to claim 7, wherein said heads-up display system is a hologram system.

9. A display device according to claim 7, wherein said heads-up display system is a dichroic system.

10. A display device according to claim 1, wherein said luminescent panel provides a direct-viewing type display.

11. A display device according to claim 1, wherein said luminescent panel comprises said electroluminescent elements for respectively emitting R, G and B light, thereby being capable of a full-color display.

12. The display device according to claim 1, wherein the dielectric mirror comprises a $SiO_2$ layer and a $TiO_2$ layer.

13. A heads-up display (HUD) system comprising:
   a) an organic electroluminescent (EL) display configured to emit an image, the organic EL display including:
   1) a luminescent panel containing a plurality of organic electroluminescent elements, each of the organic electroluminescent elements including:
   a glass substrate,
   a dielectric mirror formed on the glass substrate,
   a hole transport layer,
   a transparent electrode disposed between the dielectric mirror and the hole transport layer,
   a luminous layer formed on the hole transport layer, and
   a metal electrode formed on the luminous layer; and
   2) a driver configured to drive the plurality of organic electroluminescent elements on the luminescent panel; and
   b) a mirror configured to reflect the image from the organic EL display onto a windshield.

14. A display device comprising:
   a) a luminescent panel having a plurality of organic electroluminescent elements arranged in a matrix formation, wherein each of said plurality of organic electroluminescent elements includes:
   a dielectric mirror,
   a transparent electrode formed on said dielectric mirror,
   a plurality of organic layers including a luminous layer, formed on said transparent electrode, and
   a metal electrode formed on said plurality of organic layers;
   wherein the dielectric mirror and the metal electrode constitute a micro-optical resonator that causes light of a given wavelength to resonate, and are spaced apart by about half the given wavelength to about one full given wavelength of the light that is resonated; and
   b) a driver for driving said electroluminescent elements on said luminescent panel.

15. A display device according to claim 14, wherein said transparent electrode and said metal electrode intersect, said luminescent panel having a pixel arranged at an intersection of said transparent electrode and said metal electrode in a matrix formation, and wherein display is performed by a matrix drive that controls a voltage between said transparent electrode and said metal electrode.

16. A display device according to claim 14, further comprising a projection lens through which light from said luminescent panel is projected onto a screen.

17. A display device according to claim 16, further comprising additional luminescent panels, each of the luminescent panels having different luminescent colors, light emission of said panels being individually controlled, and rays of light from said luminescent panels being combined and projected onto a screen.

18. A display device according to claim 17, wherein said luminescent panels respectively emit red, green and blue rays of light.

19. A display device according to claim 18, wherein the rays of light from said luminescent panels are combined by a dichroic prism.

20. A display device according to claim 14, wherein light including video information generated from said luminescent panel is used in a heads-up display system.

21. A display device according to claim 20, wherein said heads-up display system is a hologram system.

22. A display device according to claim 20, wherein said heads-up display system is a dichroic system.

23. A display device according to claim 14, wherein said luminescent panel provides a direct-viewing type display.

24. A display device according to claim 14, wherein said luminescent panel comprises said electroluminescent elements for respectively emitting R, G and B light, thereby being capable of a full-color display.

25. The display device according to claim 14, wherein the dielectric mirror comprises a $SiO_2$ layer and a $TiO_2$ layer.

* * * * *

UNITED STATES PATENT AND TRADEMARK OFFICE
CERTIFICATE OF CORRECTION

PATENT NO.    : 6,259,423 B1
DATED         : July 10, 2001
INVENTOR(S)   : Tokito et al.

It is certified that error appears in the above-identified patent and that said Letters Patent is hereby corrected as shown below:

Title page,
Item [75], the inventor's information should read:
-- [75] Inventors: Shizuo Tokito; Yasunori Taga, both of Aichi-gun (JP) --

Item [73], the Assignee's information should read:
-- [73] Assignee: Kabushiki Kaisha Toyota Chuo Kenkyusho, Aichi-gun (JP)

Signed and Sealed this

Twelfth Day of February, 2002

*Attest:*

JAMES E. ROGAN
*Attesting Officer*    *Director of the United States Patent and Trademark Office*